United States Patent
Khodabandehlou et al.

(10) Patent No.: US 10,456,819 B2
(45) Date of Patent: *Oct. 29, 2019

(54) MEMORY INTERFACE CONFIGURABLE FOR ASYNCHRONOUS AND SYNCHRONOUS OPERATION AND FOR ACCESSING STORAGE FROM ANY CLOCK DOMAIN

(71) Applicant: Cypress Semiconductor Corporation, San Jose, CA (US)

(72) Inventors: Hamid Khodabandehlou, Milpitas, CA (US); Syed Babar Raza, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 288 days.

This patent is subject to a terminal disclaimer.

(21) Appl. No.: 15/273,426

(22) Filed: Sep. 22, 2016

(65) Prior Publication Data

US 2017/0011786 A1 Jan. 12, 2017

Related U.S. Application Data

(63) Continuation of application No. 13/312,929, filed on Dec. 6, 2011, which is a continuation of application No. 11/954,622, filed on Dec. 12, 2007, now Pat. No. 8,266,405.

(60) Provisional application No. 60/869,784, filed on Dec. 13, 2006.

(51) Int. Cl.
*G11C 7/10* (2006.01)
*B21C 23/08* (2006.01)
*G11C 7/22* (2006.01)
*G11C 11/406* (2006.01)

(52) U.S. Cl.
CPC .......... *B21C 23/085* (2013.01); *G11C 7/1039* (2013.01); *G11C 7/1045* (2013.01); *G11C 7/1072* (2013.01); *G11C 7/22* (2013.01); *G11C 11/40615* (2013.01)

(58) Field of Classification Search
CPC ................ G11C 7/1072; G11C 7/1038; G11C 11/40615

See application file for complete search history.

(56) References Cited

U.S. PATENT DOCUMENTS

| 4,442,532 A | 4/1984 | Takemura |
| 4,615,017 A | 9/1986 | Finlay et al. |
| 5,384,737 A * | 1/1995 | Childs ................. G11C 7/1039 365/189.04 |

(Continued)

FOREIGN PATENT DOCUMENTS

| EP | 1122734 A | 8/2001 |
| JP | 2001243778 A | 9/2001 |

OTHER PUBLICATIONS

Chu, Pong P. Register Transfer Level (RTL) Hardware Design Using VHDL. Hoboken, NJ: J. Wiley & Sons, Apr. 2006.*

(Continued)

*Primary Examiner* — Ramon A. Mercado

(57) ABSTRACT

A system comprising a memory controller coupled to a memory device is described. The memory device is coupled to, and is external to, the memory controller. The memory device includes a storage array having dual configurability to support both synchronous and asynchronous modes of operation.

5 Claims, 5 Drawing Sheets

(56) References Cited

U.S. PATENT DOCUMENTS

| | | | |
|---|---|---|---|
| 5,386,385 | A | 1/1995 | Stephens, Jr. |
| 5,398,212 | A | 3/1995 | Imura et al. |
| 5,548,560 | A | 8/1996 | Stephens et al. |
| 5,617,555 | A | 4/1997 | Patel et al. |
| 5,625,593 | A | 4/1997 | Kimura |
| 5,634,139 | A | 5/1997 | Takita |
| 5,793,693 | A | 8/1998 | Collins et al. |
| 5,893,136 | A | 4/1999 | Stolt et al. |
| 5,923,615 | A | 7/1999 | Leach et al. |
| 5,926,434 | A | 7/1999 | Mori |
| 5,953,285 | A | 9/1999 | Churchill et al. |
| 6,026,465 | A | 2/2000 | Mills et al. |
| 6,088,760 | A | 7/2000 | Walker et al. |
| 6,134,638 | A | 10/2000 | Olarig et al. |
| 6,172,936 | B1 | 1/2001 | Kitazaki |
| 6,178,138 | B1 | 1/2001 | Derbenwick et al. |
| 6,189,076 | B1 | 2/2001 | Fadavi-Ardekani et al. |
| 6,327,175 | B1 * | 12/2001 | Manapat .............. G11C 7/1018 365/154 |
| 6,532,522 | B1 | 3/2003 | Barth et al. |
| 6,587,913 | B2 | 7/2003 | Campanale et al. |
| 6,658,544 | B2 | 12/2003 | Gray |
| 6,784,699 | B2 | 8/2004 | Haroun et al. |
| 6,791,898 | B1 | 9/2004 | Manapat et al. |
| 6,920,524 | B2 | 7/2005 | Lovett |
| 6,948,084 | B1 | 9/2005 | Manapat et al. |
| 6,973,009 | B2 | 12/2005 | Toda et al. |
| 7,085,906 | B2 * | 8/2006 | Barth ...................... G06F 13/16 711/105 |
| 7,184,359 | B1 | 2/2007 | Bridgewater et al. |
| 7,210,015 | B2 | 4/2007 | Barth et al. |
| 7,251,171 | B2 * | 7/2007 | Nishimura ........... G11C 7/1045 365/189.02 |
| 7,315,929 | B2 | 1/2008 | Barth |
| 7,615,929 | B2 | 11/2009 | Bewlay et al. |
| 8,266,405 | B2 | 9/2012 | Khodabandehlou et al. |
| 2005/0111286 | A1 | 5/2005 | Toda et al. |
| 2005/0226090 | A1 * | 10/2005 | Lee ...................... G11C 7/1045 365/233.1 |
| 2005/0243612 | A1 | 11/2005 | Barth et al. |
| 2008/0148085 | A1 | 6/2008 | Khodabandehlou et al. |

OTHER PUBLICATIONS

International Search Report for International Application No. PCT/US07/87179 dated Aug. 25, 2008; 3 pages.

USPTO Advisory Action for U.S. Appl. No. 13/312,929 dated Jul. 29, 2013; 3 pages.

USPTO Advisory Action for U.S. Appl. No. 13/312,929 dated Aug. 5, 2014; 3 pages.

USPTO Advisory Action for U.S. Appl. No. 13/312,929 dated Oct. 18, 2013; 2 pages.

USPTO Final Rejection for U.S. Appl. No. 11/954,622, dated Jan. 26, 2011; 10 pages.

USPTO Final Rejection for U.S. Appl. No. 13/312,929 dated Apr. 22, 2013; 12 pages.

USPTO Final Rejection for U.S. Appl. No. 13/312,929 dated May 23, 2014; 13 pages.

USPTO Non-Final Rejection for U.S. Appl. No. 11/954,622, dated Sep. 29, 2010; 7 pages.

USPTO Non-Final Rejection for U.S. Appl. No. 13/312,929 dated Jan. 2, 2015; 12 pages.

USPTO Non-Final Rejection for U.S. Appl. No. 13/312,929 dated Jan. 3, 2014; 14 pages.

USPTO Non-Final Rejection for U.S. Appl. No. 13/312,929 dated Jun. 20, 2012; 16 pages.

USPTO Non-Final Rejection for U.S. Appl. No. 13/312,929 dated Dec. 11, 2012; 10 pages.

USPTO Notice of Allowance for U.S. Appl. No. 11/954,622 dated Jun. 26, 2012; 8 pages.

USPTO Notice of Allowance for U.S. Appl. No. 11/954,622 dated Jul. 17, 2012; 8 pages.

USPTO Notice of Allowance for U.S. Appl. No. 11/954,622, dated Apr. 14, 2011; 7 pages.

USPTO Notice of Allowance for U.S. Appl. No. 11/954,622, dated Jul. 30, 2012; 5 pages.

USPTO Notice of Allowance for U.S. Appl. No. 11/954,622 dated Nov. 8, 2011; 8 pages.

USPTO Notice of Allowance for U.S. Appl. No. 13/312,929 dated Apr. 7, 2015; 10 pages.

USPTO Notice of Allowance for U.S. Appl. No. 13/312,929 dated Apr. 11, 2016; 5 pages.

USPTO Notice of Allowance for U.S. Appl. No. 13/312,929 dated Nov. 18, 2015; 5 pages.

USPTO Notice of Allowance for U.S. Appl. No. 13/312,929 dated Jul. 21, 2016; 5 pages.

Written Opinion of the International Searching Authority for International Application No. PCT/US07/87179 dated Aug. 25, 2008; 5 pages.

USPTO Notice of Allowance for U.S. Appl. No. 13/312,929 dated Nov. 22, 2016; 5 pages.

USPTO Notice of Allowance for U.S. Appl. No. 13/312,929 dated Mar. 30, 2017; 5 pages.

* cited by examiner

MEMORY INTERFACE CONFIGURABLE FOR ASYNCHRONOUS AND SYNCHRONOUS OPERATION AND FOR ACCESSING STORAGE FROM ANY CLOCK DOMAIN

PRIORITY CLAIM

This application is a continuation of U.S. patent application Ser. No. 13/312,929, filed on Dec. 6, 2011, which is a continuation of U.S. patent application Ser. No. 11/954,622, filed on Dec. 12, 2007, which claims priority to U.S. Provisional Application No. 60/869,784, filed on Dec. 13, 2006, all of which are incorporated by reference herein in their entirety.

BACKGROUND OF THE INVENTION

1. Field of the Invention

This invention relates to electronic circuits and, more particularly, to a memory interface circuit, which can be configured for asynchronous and synchronous operation. In addition, the memory interface circuit can be configured for accessing a storage element using one of multiple clock signals available to the memory device.

2. Description of the Related Art

The following descriptions and examples are given as background only.

As shown in FIG. 1, a typically memory device 100 may include an input/output (I/O) block 110, a memory interface 120, and a storage array 130. In some cases, storage array 130 may be implemented with volatile or non-volatile memory storage elements. Types of volatile memory include memory that must be periodically refreshed (e.g., Dynamic Random Access Memory or DRAM) or mommy that will lose its programmed state if power is removed (e.g., Static RAM or SRAM). Typos of non-volatile memory include memory that maintains its programmed state when power is removed (e.g., Electrically Erasable Programmable Read Only Memory or EEPROM, Flash Magnetic RAM or MRAM, etc.) In other cases, storage array 130 may be implemented as an array of register elements (e.g., an array of flip-flops or latches).

Memory interface 120 is configured for receiving the address, data, clock and/or control signals needed to access storage array 130. In some cases, memory interface 120 may receive the signals from I/O block 110. Access to the storage elements may be performed in a synchronous or asynchronous manner, depending on the signals received and the particular type of storage elements used in the array. In synchronous memory architectures, access to the storage elements is controlled by a clocking signal (e.g., a system clock or memory controller clock). However, no such clocking signal is needed in asynchronous memory architectures, where access is instead coordinated with respect to an asynchronous control signal. Examples of synchronous memory include SRAM and Synchronous DRAM (SDRAM). Examples of asynchronous memory include SRAM and various types of DRAM (e.g., Extended Data Output or EDO and Fast Page Mode (FPM) DRAM).

In most cases, the memory interface may be configured for operating in a synchronous mode or an asynchronous mode, but not both. For example, FIG. 2 illustrates one embodiment of a memory interface 200 configured for operating in asynchronous mode. As shown in FIG. 2, an asynchronous memory interface may include an address latch 210, a storage array 220, a data latch 230, and a self-timed control logic block 240. During read operations, the address ("Address") and output data ("Out") are latched with respect to an asynchronous control signal ("Control"). In some cases, the address, data and asynchronous control signal may be supplied to memory interface 120 by a device (e.g., a controller) wishing to gain access to the memory.

FIG. 3 illustrates one embodiment of a memory interface 300 configured for operating in synchronous mode. As shown in FIG. 3, a synchronous memory interface may include an address register 310, a storage array 320, and a data register 330. The use of registered elements enables memory accesses to be coordinated with a clocking signal ("Clock") supplied to the memory interface. In some cases, an interface clock signal may be used to move information through the memory. For example, a registered address ("Address") may be latched to storage array 310 upon receiving a first rising edge of the interface clock signal ("Clock"). The data associated with the address may be latched into data register 330 on the next rising edge of the interface clock. In this manner, movement through the memory may be coordinated in sync with the rising (or falling) edge of the interface clock.

Unfortunately, the conventional memory interfaces shown in FIGS. 2 and 3 present many disadvantages. For example, the memory interfaces shown in these figures are only designed to operate in one mode (e.g., synchronous or asynchronous). They do not provide the flexibility of accessing storage elements in either mode. Therefore, the memory interfaces cannot be used alone to provide both synchronous and asynchronous operation in storage arrays (e.g., SRAM) that support both modes of operation. The memory interfaces shown in FIGS. 2 and 3 also require the storage elements to reside in a single clock domain (e.g., the interface clock domain, as discussed above). This prevents the memory interfaces from being used when access to the storage elements is controlled by more than one clock domain (e.g., when a storage array is read from one clock domain and written to from another clock domain).

Therefore, a need exists for an improved memory interface, which may be configured for accessing storage elements in either synchronous or asynchronous mode. An improved memory interface is also needed in which access to the storage elements is provided from substantially any clock domain.

SUMMARY OF THE INVENTION

The following description of various embodiments of memory devices, memory interface circuits and methods is not to be construed in any way as limiting the subject matter of the appended claims.

According to one embodiment, a memory device is provided herein. In general, the memory device may include a memory interface circuit and at least one storage array. In some cases, however, a plurality of storage arrays may be included. The memory interface circuit may be configured for accessing a storage array in a select one of two available modes, including a synchronous mode and an asynchronous mode. In some cases, the memory interface circuit may be configured for accessing the plurality of storage arrays in synchronous mode during a first time period, and in asynchronous mode during a second time period, which is distinct from the first. In other cases, the memory interface circuit may be configured for accessing one of the storage arrays in synchronous mode and another of the storage arrays in asynchronous mode. In either case, the memory interface circuit must be configured or reconfigured for operating in the chosen mode.

In some cases, the type of storage array included within the memory device may be capable of supporting both synchronous and asynchronous modes of operation. In other cases, different types of storage arrays may be included for supporting synchronous and asynchronous modes. In one embodiment, the storage arrays may be selected from a group comprising SRAM, DRAM, registers and latches, to name a few.

In one embodiment, the memory interface circuit may include address interface logic for accessing a storage array in accordance with a selected mode of operation, data interface logic for outputting data retrieved from the storage array and control logic for controlling the manner in which the data is output from the memory device. In most cases, the memory interface circuit components may be coupled for receiving an address of data to be accessed and a high speed clock signal. Depending on the mode selected for accessing the storage array, the interface components may also receive a clock signal (when operating in synchronous mode) or an asynchronous control signal (when operating in asynchronous mode).

The memory interface circuit may include address interface logic, which is configured for supplying a latched address to the storage array when operating in the asynchronous mode, and for supplying a registered address to the storage array when operating in the synchronous mode. In one embodiment, the address interface, logic may include an address latch, an address register and an address multiplexer. When operating in asynchronous mode, the address latch is coupled for latching the address to a corresponding storage array under the control of the asynchronous control signal. When operating in synchronous mode, the address register is coupled for supplying the address to the corresponding storage array in synchronization with the clock signal. The address multiplexer is coupled to the address latch and the address register for selectively forwarding either the latched address or the registered address to the corresponding storage array, depending on the mode selected for accessing the storage array.

The memory interface circuit may also include data interface logic, which is configured for outputting latched data from the memory storage array when operating in the asynchronous mode, and for outputting registered data from the memory storage array when operating in the synchronous mode. In one embodiment, the data interface circuit may include a data latch, a data register and a data multiplexer. When operating in asynchronous mode, the data latch is coupled for latching output data from the corresponding storage array under the control of a control signal, which is generated within the memory interface circuit. The control signal will be described in more detail below. When operating in synchronous mode, the data register is coupled for supplying output data from the corresponding storage array in synchronization with the clock signal. The data multiplexer is coupled to the data latch and the data register for selectively forwarding the latched output data or the registered output data out of the memory device, depending on the mode selected for accessing the storage array.

The memory interface circuit may also include control logic, which ensures that the output data is stable, regardless of the mode selected for accessing the corresponding storage array. During asynchronous mode, the control logic may generate the control signal, which is supplied to the data latch for latching the output data to the data multiplexer, by synchronizing the asynchronous control signal to the high speed clocking signal. For example, the control logic may include a control signal multiplexer, a chain of registers and a first logic gate. The control signal multiplexer is coupled for selectively forwarding the clock signal or the asynchronous control signal to the chain of registers, depending on the mode selected for accessing the storage array. The chain of registers is coupled for propagating the signal selectively forwarded by the control signal multiplexer in synchronization with the high speed clocking signal. The first logic gate is coupled to the outputs of the last two registers in the chain for generating the control signal.

In some cases, access to a first storage array may be controlled by a substantially different clock signal than the one supplied to the memory interface circuit and the other storage arrays. In other words, the first storage array may reside within a substantially different clock domain than the other interface components and storage arrays. When this occurs, additional control logic may be included within the memory interface circuit for synchronizing all storage accesses to the same clock. If the data stored within the first storage array at the addressed location were to change during a read access, the control logic would prevent the change from propagating to the output, thereby preventing errors in the output data.

In one embodiment, the control logic may use the high speed clocking signal and either the clock signal or the asynchronous control signal to generate a pulse, which prevents data updates within the first storage array from propagating to the output when the pulse is asserted. For example, the control logic may include, in addition to the components mentioned above, a second logic gate, at least one multiplexer coupled to the first storage array and at least one to register coupled to the data interface logic. The second logic gate is coupled to the outputs of the last two registers in the chain for generating the pulse. When the address supplied to the memory interface circuit corresponds to data stored within the first storage array, the at least one multiplexer is configured to: (i) pass the data from the first storage array to the at least one register if the pulse is deasserted, or (ii) prevent the data from the first storage array from passing to the at least one register if the pulse is asserted.

BRIEF DESCRIPTION OF THE DRAWINGS

Other objects and advantages of the invention will become apparent upon reading the following detailed description and upon reference to the accompanying drawings in which.

Figure 1:
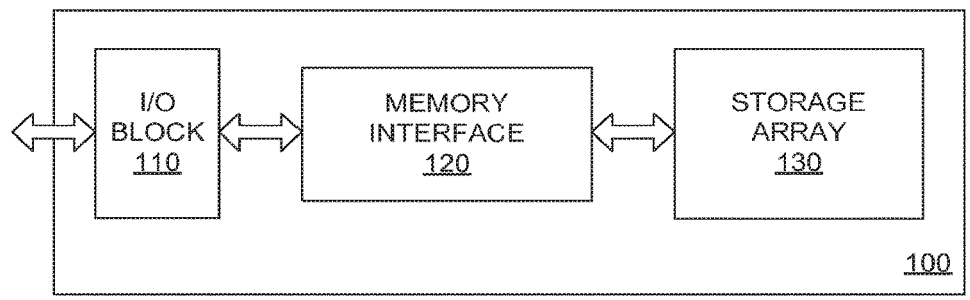
FIG. 1 is a simplified block diagram illustrating an exemplary memory device including, but not limited to, an I/O block, a memory interface and a memory array.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 4:
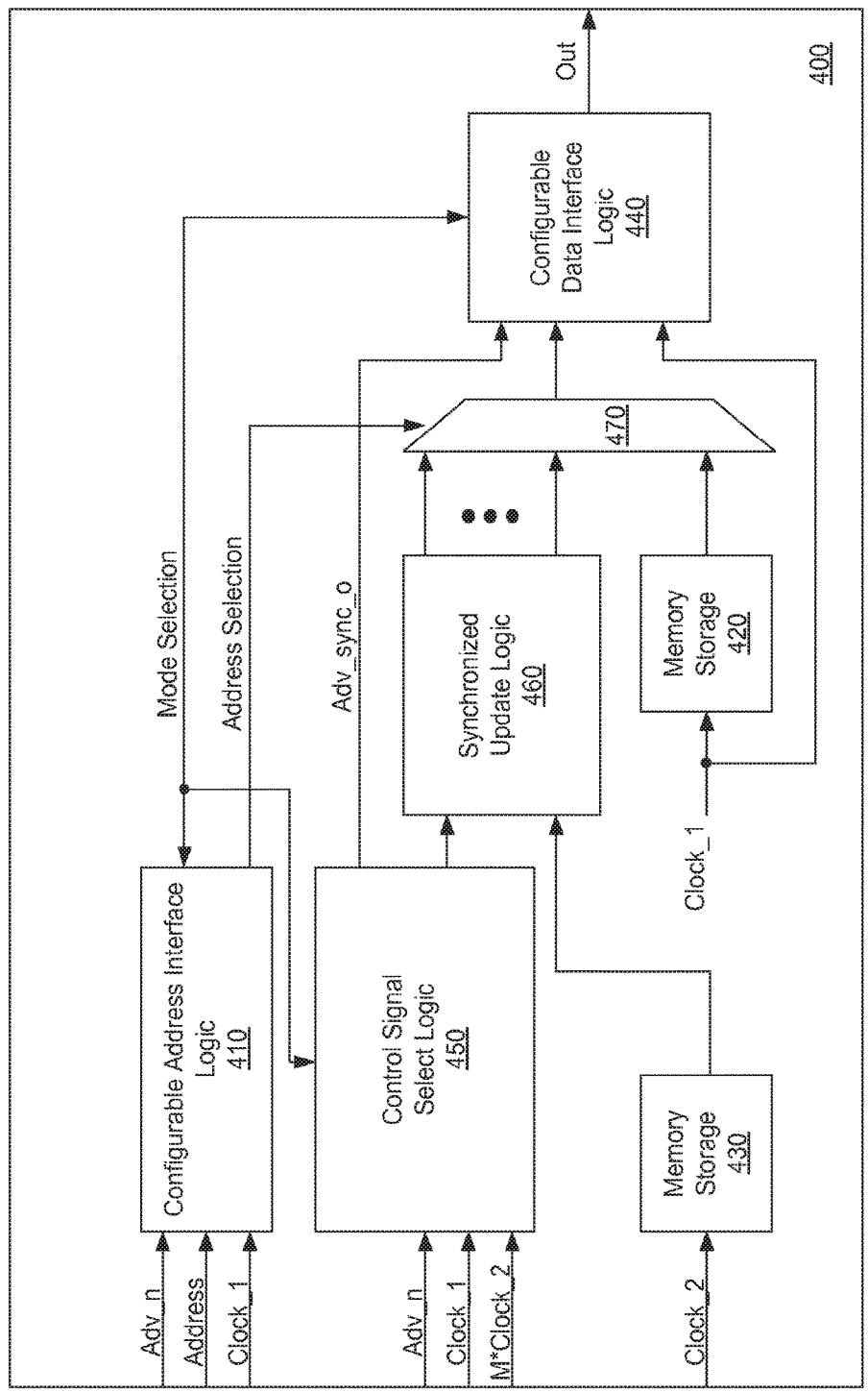
FIG. 4 is a block diagram illustrating an improved memory interface, according to one embodiment of the invention.

FIG. 4 illustrates one embodiment of an improved memory interface (400) in accordance with the present invention. As described in more detail below, memory interface 400 improves upon conventional architectures by: (i) providing the flexibility of accessing storage elements in one of two available modes (synchronous and asynchronous), (ii) providing access to a plurality of storage arrays, at least one of which resides within a different clock domain than the other interface components, and (iii) providing means for guaranteeing that the data output from the storage arrays will be stable, regardless of the clock domain or mode chosen for accessing the data. Other advantages may become apparent in light of the description provided below.

As used herein, two storage arrays may reside within different "clock domains" if the storage arrays are accessed with asynchronous clock frequencies. For example, storage elements residing within a first clock domain may be accessed by a 100 MHz clock signal, whereas a 50 Mhz clock signal may be used to access storage elements within a second clock domain. In some cases, storage elements residing within the second clock domain may be accessed with a different clock signal than that used by the memory interface. It should be noted, however, that the storage arrays described herein are not limited to a particular set of clock frequencies or clock domains, and may be accessed using substantially any clock signal supplied to, or generated within, the memory device.

As shown in FIG. 4, memory interface 400 includes a configurable address interface logic block 410, a configurable data interface logic block 440, a control signal select logic block 450, a synchronized update logic block 460 and a multiplexer 470. In addition to these components, memory interface 400 also includes at least two storage arrays, such as the first storage array 420 and the second storage array 430. Although two storage arrays are illustrated for the purpose of simplicity, the improved memory interface is not limited to only two such arrays. In a general embodiment, the improved memory interface described herein may include a plurality of storage arrays, where a "plurality" is roughly defined as a number greater than or equal to two. As set forth below, the improved memory interface may be particularly useful when one or more of the storage arrays resides within a different clock domain than the other storage array(s) and interface components. The storage arrays included within the improved memory interface may be redundant storage, or may simply be accessed by more than one clock domain. In addition, the storage arrays may be implemented with similar or different types of memory. The storage arrays may be configured for operating in only one mode (e.g., synchronous or asynchronous) or may have dual configurability. Examples of storage arrays having dual configurability include, but are not limited to, SRAM, DRAM, registers, and latches.

In the illustrated embodiment, the second storage array 430 resides within a different clock domain than the first storage array 420 and at least some of the other interface components (e.g., 410, 440, and 450). As such, storage array 430 is controlled by a substantially different clock signal ("clock_2") than the clock signal ("clock_1") used to control storage array 420 and the other interface components. In one example, the clock_2 signal may be a core clock or system clock signal, which is supplied to the memory device by the system (not shown) or an external controller (not shown) attempting to access the second storage array. However, the clock_2 signal is not limited to a particular clocking signal, and may instead, comprise any clock signal supplied to, or generated within, the memory device.

Address interface logic block 410 is coupled for receiving the address, clock and control signals from an input/output (I/O) interface block, such as block 110 of FIG. 1. In one embodiment, the clock signal ("clock_1") supplied to logic block 410 may be an interface clock, which is supplied to the memory device by the system (not shown) or the external controller (not shown). However, the clock_1 signal is not limited to a particular clocking signal, and may instead, comprise any clock signal supplied to, or generated within, the memory device.

Address interface logic block 410 is coupled for receiving a mode selection signal indicating a chosen mode (e.g., synchronous or asynchronous mode) for accessing one or more of the storage arrays. In one embodiment, the mode selection signal may be supplied to logic block 410 by the external controller attempting memory access. In some cases, the mode selection signal may depend on the storage array(s) being accessed. For example, it may be preferable to access one or more of the storage arrays using one mode of operation (e.g., synchronous mode), while other storage arrays are accessed using another mode of operation. In other cases, a single mode selection signal may be chosen for accessing all storage arrays during a given time period. For example, one mode of operation (e.g., synchronous mode) may be chosen for accessing each of the storage arrays during a first time period. However, the flexibility provided herein enables the improved memory interface 400 to be reconfigured at any time, so that another mode of operation (e.g., asynchronous mode) could be used for accessing the storage arrays during another time period.

Depending on the chosen mode of operation, address interface logic block 410 may be configured for registering (synchronous mode) or latching (asynchronous mode) the address of the storage element(s) to be accessed. In synchronous mode, a clocking signal ("clock_1") is used to register the address supplied to logic block 410. In asynchronous mode, the address is latched by an asynchronous control signal ("Adv_n") supplied to logic block 410. In some cases, the asynchronous control signal may be supplied by the external controller, which is trying to access the first or second storage array. Exemplary controllers may include, but are not limited to, microprocessors, microcontrollers and application specific integrated circuits (ASICs).

The data interface logic block 440 is coupled for receiving output data from the first storage array 420 or the second storage array 430 via multiplexer 470. The data interface logic block is also coupled for receiving the mode selection signal. Similar to address interface logic block 410, the data interface logic block 440 may be configured for registering (synchronous mode) or latching (asynchronous mode) the output data in accordance with the chosen mode of operation. In synchronous mode, a clocking signal ("clock_1") is used to register the output data. In asynchronous mode, the output data is latched by an internally generated control signal ("Adv_sync_o"), which is related to the asynchronous control ("Adv_n") signal and supplied by the control signal select logic block (450).

Control signal select logic block 450 is included within memory interface 400 to ensure that the output data is stable when operating in asynchronous mode. As set forth in more detail below, control signal select logic block 450 controls the opening and closing of the data latch included within data interface logic 440 to ensure that no metastability occurs. As used herein, a "metastable state" is one which is neither high nor low, but some intermediate value there between. To avoid metastability (and thus, data corruption), output data from the storage array must arrive at the data latch at least a set up time before the clock signal arrives at the latch. If the data arrives within or after the set up time, metastability may occur and the data may not latch correctly. Data which is generated within one clock domain and then used in another clock domain is particularly susceptible to metastability problems, because the data is no longer in sync with the clock and can arrive at any point in time.

Control signal select logic block 450 avoids metastability when operating in asynchronous mode by synchronizing the Adv_n control signal to a high speed clock signal. In one embodiment, the high speed clock may be some multiple of the clock signal (e.g., M*clock_2) supplied to second storage array 430. In a general embodiment, however, the high speed clock may simply be several times faster than the other clock signals supplied to the storage arrays. The synchronized control signal ("Adv_sync_o") generated by logic block 450 is supplied to data interface logic block 440 for controlling the opening and closing of the data latch contained therein. In one embodiment, the Adv_sync_o control signal may be configured for opening the data latch as early as possible and for closing the data latch in sync with the high speed clock. Controlling the data latch in such a manner avoids metastability (and thus, data corruption) in the output data by guaranteeing that the output data will arrive at the data latch at least a set up time before the Adv_sync_o control signal is deasserted to close the data latch.

In some embodiments, the clock signal ("clock_2") used for accessing second storage array 430 may differ significantly from the clock signal ("clock_1") supplied to data interface logic 440. In these embodiments, means are needed to ensure that, if the data on the storage element changes during the access, the change won't propagate to the output of the memory interface to corrupt the output data. Synchronized update logic block 460 is included within memory interface 400 for this purpose. In general, logic block 460 avoids data corruption by synchronizing the output data from second storage array 430 to a high speed clock. As noted above, the high speed clock may be some multiple of the clock signal (e.g., M*clock_2) supplied to second storage array 430. As described in more detail below, logic block 460 may use the high speed clock to generate a one-shot signal ("shadow_enable") to perform data updates. In one embodiment, data stored within second storage array 430 may be allowed to propagate to the output while the one-shot signal is deasserted. However, once the one-shot signal is asserted, changes to the data contained within second storage array 430 are prohibited from propagating to the output.

Multiplexer 470 is included within memory interface 400 for selectively forwarding output data from one of the plurality of storage arrays to data interface logic 440. In the illustrated embodiment, output data is selectively forwarded from either first storage array 420 or second storage array 430. In other words, multiplexer 470 selects data from either the first clock domain (i.e., the clock_1 domain) or the second clock domain (i.e., the clock_2 domain) to be output from the memory interface (via data interface logic 440). It is noted, however, that multiplexer 470 is not limited to selecting output data from only two clock domains. In general, multiplexer 470 may be configured for passing output data from substantially any number of storage arrays residing within substantially any number of clock domains.

As shown in FIG. 4, the address supplied to address interface logic 410 is forwarded to multiplexer 470 for accessing a corresponding one of the storage arrays (i.e., the array containing the addressed data). In some cases, the address may also be forwarded to the corresponding storage array (e.g., when the storage arrays include some type of random access memory). However, it may not always be necessary to forward the address to the storage arrays. For example, the address does not need to be supplied to the storage arrays when the arrays include a bank of First-Out-First-In (FIFO) registers.

Memory interface 400 will now be described in more detail in reference to FIG. 5, which provides a simplified circuit schematic of the memory interface according to one embodiment of the invention. Although a particular circuit schematic is shown in the figures and described herein, one skilled in the art will recognize how the memory interface architecture may differ from the embodiment shown, while retaining the operational features and advantages described herein.

Figure 5:
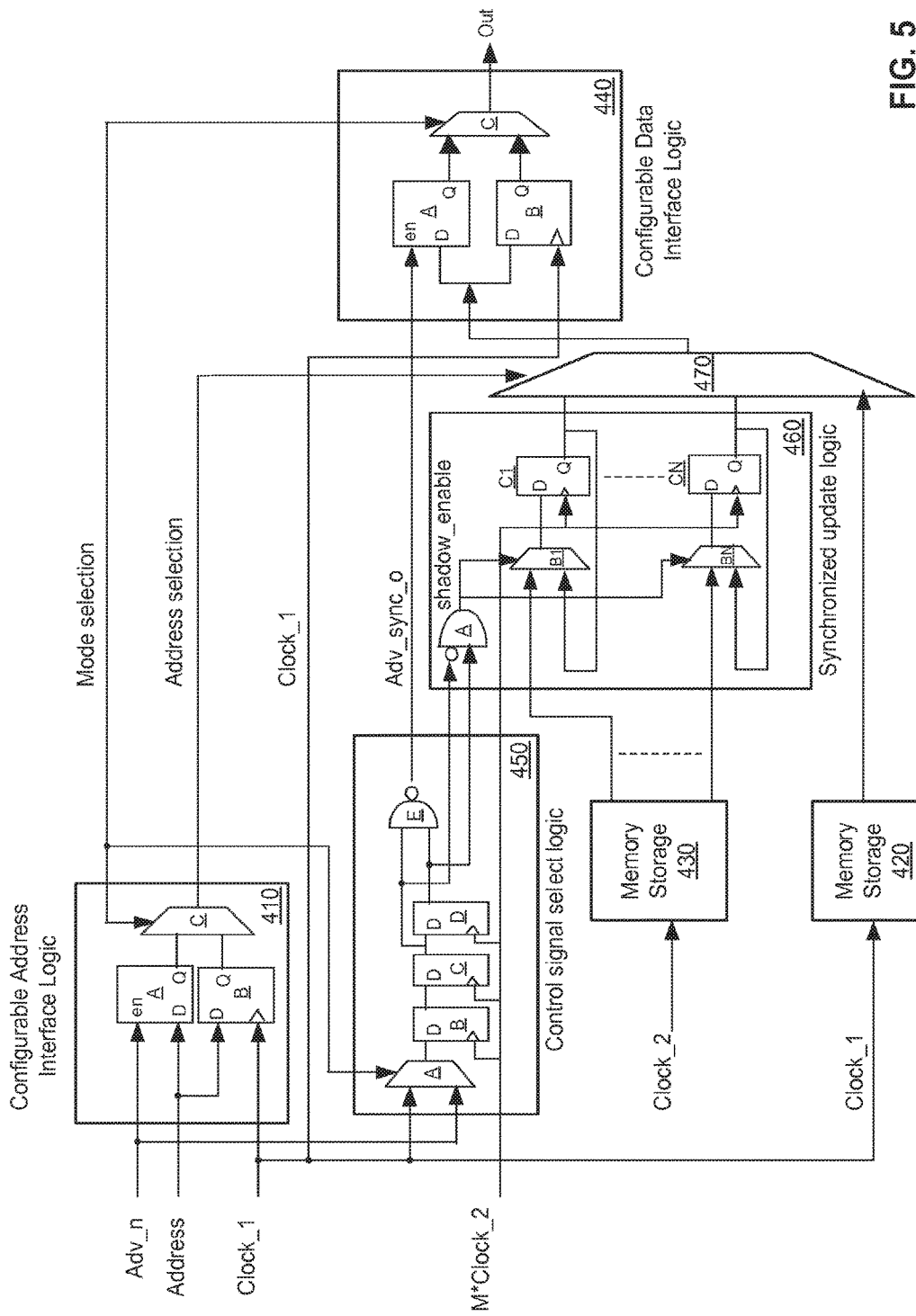
FIG. 5 is a block diagram illustrating the memory interface of FIG. 4 in more detail.

As shown in the embodiment of FIG. 5, address interface logic 410 may include an address latch 410A, an address register 410B, and a multiplexer 410C. Multiplexer 410C is configured for supplying the latched address or the registered address to multiplexer 470, depending on the chosen mode of operation. For example, the address may be provided by address latch 410A when operating in asynchronous mode, or address register 410B when operating in synchronous mode.

In one embodiment, address latch 410A may include a D-type latch having a data input (D), a data output (Q) and an enable input (en). The enable input may be active low or active high, as known in the art. When operating in asynchronous mode, an asynchronous control signal ("Adv_n") is supplied to the enable input (en) of address latch 410A for latching the address to multiplexer 410C. Once latched, the address is forwarded to multiplexers 410C and 470 for selecting the appropriate data from storage array 420 or 430.

In one embodiment, address register 410B may include a D-type flip-flop having a data input (D), a data output (Q) and a clock input (e.g., clock_1), which is used for synchronizing data transfer through the flip-flop. The clock input may be rising edge or falling edge triggered, as known in the art. When operating in synchronous mode, the incoming address is registered within address register 410B and supplied to multiplexer 410C in sync with the clock_1 signal. The registered address is then forwarded to multiplexer 470 for selecting the appropriate data from storage array 420 or 430.

In a similar manner, data interface logic block 440 may include a data latch 440A, a data register 440B, and a multiplexer 440C. Multiplexer 440C is configured for outputting the latched data (A) or the registered data (B) from memory interface 400, depending on the chosen mode of operation. For example, the output data ("Out") may be provided by data latch 440A when operating in asynchronous mode, or address register 410B when operating in synchronous mode.

In one embodiment, data latch 440A may include a D-type latch having a data input (D), a data output (Q) and an enable input (en). The enable input may be active low or active high, as known in the art. When operating in asynchronous mode, an internally generated control signal ("Adv_sync_o") is supplied to the enable input of data latch 440A for latching the output data to multiplexer 440C. The output data is then forwarded out of the memory device via multiplexer 440C.

In one embodiment, data register 440B may include a D-type flip-flop having a data input (D), a data output (Q) and a clock input (e.g., clock_1), which is used for synchronizing data transfer through the flip-flop. The clock input may be rising edge or failing edge triggered, as known in the art. When operating in synchronous mode, the output data is registered within data register 440B and supplied to multiplexer 440C in sync with the clock_1 signal. The output data is then forwarded out of the memory device via multiplexer 440C.

As noted above, the control signal select logic block (450) may use the clock ("clock_1") and control ("Adv_n") signals supplied thereto for creating one or more signals, which are synchronized to a high speed clock signal (e.g., "M*clock_2"). In asynchronous mode, the control signal select logic block (450) creates a control signal ("Adv_sync_o") that is used to open and close data latch 440A. As shown in FIG. 5, the Adv_sync_o control signal may be created by synchronizing the asynchronous control signal ("Adv_n") to the high speed clock ("M*clock_2"). In one embodiment, data latch 440A may be open when the Adv_sync_o control signal is asserted (e.g., low) and closed when the Adv_sync_o control signal is deasserted (e.g., high). By opening the latch as soon as possible, the Adv_sync_o control signal guarantees that the output data will arrive at the data latch at least a set up time before the Adv_sync_o control signal is deasserted to close the latch. This improves reliability by avoiding metastability in the output data.

In addition to the Adv_sync_o signal, the control signal select logic block 450 creates a one-shot signal ("shadow_enable"), which is supplied to the synchronized update logic block 460 to capture data updates from second storage array 430. As noted above, data updates are allowed to propagate from the second storage array, while the one-shot signal is deasserted (e.g., for approximately one cycle of the high speed clock). Once the one-shot signal is asserted, changes to the data contained within second storage array 430 are prohibited from propagating to the output. The one-shot signal, therefore, ensures that no metastability occurs within the output data from second storage array 430.

In one embodiment, the control signal select logic block 450 may include a multiplexer 450A, a chain of registers (e.g., D-type flip-flops 450B, 450C, and 450D) and a logic gate (e.g., NAND gate 450E), as shown in FIG. 5. Multiplexer 450A is configured for selecting either the clock signal ("clock_1") or the control signal ("Adv_n") supplied to logic block 450, depending on the chosen mode of operation. The chosen signal is propagated through the serial chain of registers (e.g., 450B, 450C, and 450D) in sync with the high speed clock ("M*clock_2") by connecting the output of it preceding register to the input of a subsequent register. The outputs of the last two registers 450C/450D are supplied to the inputs of NAND gate 450E for generating the control signal ("Adv_sync_o") used to open and close data latch 440A. The outputs of registers 450C and 450D are also supplied to the complementary inputs of AND gate 460A within the synchronized update logic for generating the one-shot signal ("shadow_enable") used to capture data updates from second storage array 430.

In addition to AND gate 460A, synchronized update logic block 460 may include a plurality of multiplexers (e.g., $460B_1 \ldots 460B_N$) and a plurality of registers (e.g., D-type flip-flops $460C_1 \ldots 460C_N$), as shown in FIG. 5. In one embodiment, the plurality of registers may each store one bit of a multi-bit data bus. Each of the multiplexers $460B_i$ is coupled for receiving output data from second storage array 430, as well as registered output data from a corresponding one of the registers $460C_i$. The multiplexers $460B_i$ are configured for supplying the stored output data or the registered output data to a corresponding one of the registers $460C_i$, based on the one-shot signal ("shadow_enable") supplied thereto from the control signal select logic block 450. In one embodiment, data from storage array 430 may be supplied to registers $460C_i$ while the one-shot signal is deasserted. However, once the one-shot signal is asserted, the registered data is looped back to registers $460C_i$ to prevent data updates within storage array 430 from propagating to the output. The registered output data is forwarded from the registers $460C_i$ to multiplexer 470 in sync with the high speed clock (M*clock_2).

Logic blocks 450 and 460 ensure that the output data from second storage array 430 is stable during synchronous and asynchronous modes. In the embodiment shown, logic blocks 450 and 460 generate a one-shot signal ("shadow_enable") after a short time delay provided by multiplexer 450A, registers 450B-D and AND gate 460A. After output data front second storage array 430 is received by multiplexers $460B_i$ and propagated to registers $460C_i$, the one-shot signal is asserted (or deasserted in an alternative embodiment) to ensure that only the registered output data is supplied to multiplexer 470. Therefore, even if changes occur in the second storage array, the synchronized update logic 460 ensures that the changes won't propagate to the output (via multiplexer 470 and data interface logic 440).

Figure 6:
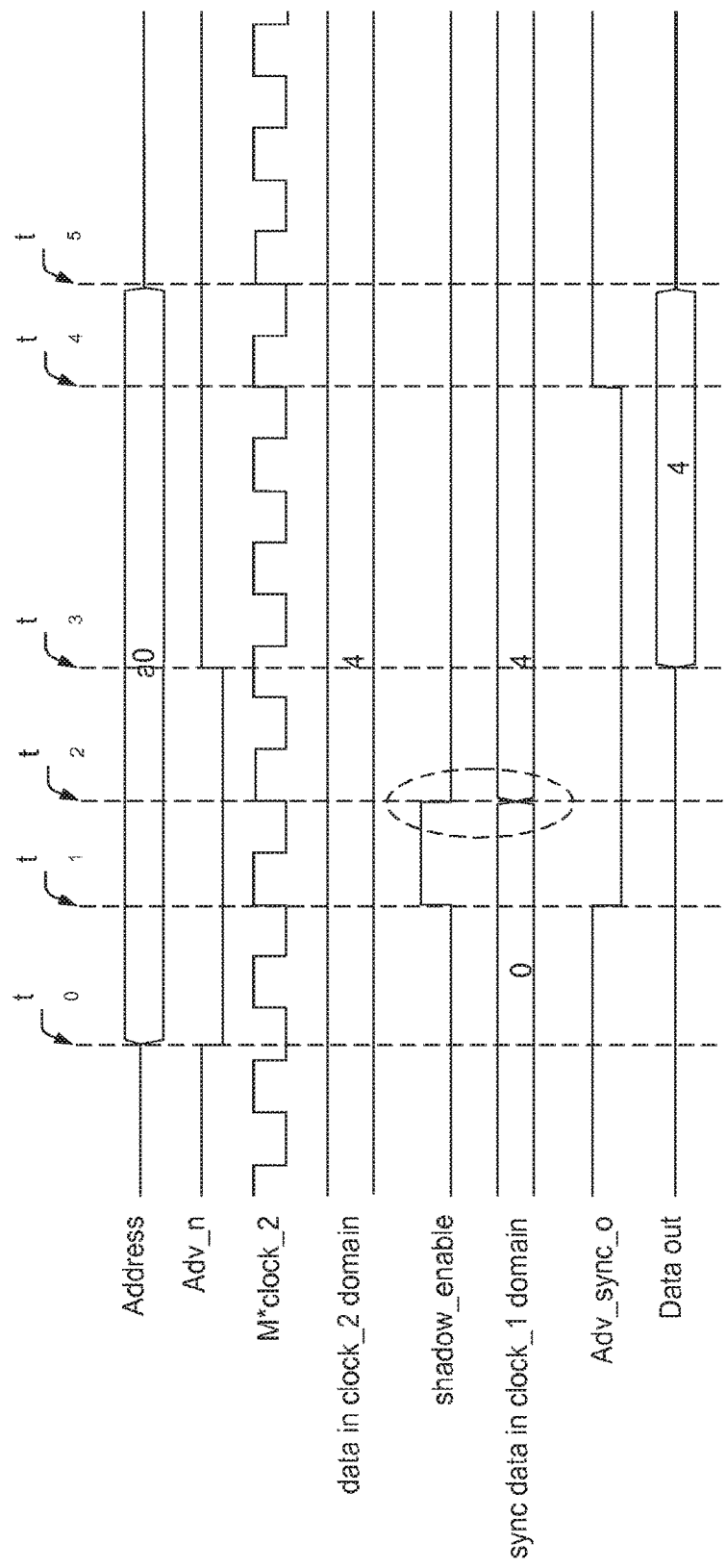
FIG. 6 is a timing diagram illustrating one manner in which data updates may be synchronized within the memory interface of FIG. 5.

A timing diagram 500 illustrating one manner in which the one-shot ("shadow_enable") signal may be used to update data is shown in FIG. 6. At time $t_0$, the memory interface circuit receives an address (a0) of data to be accessed from second storage array 430 and an asynchronous control signal ("Adv_n") indicating that the data should be accessed in an asynchronous manner. Although an asynchronous memory access is illustrated in FIG. 6, one skilled in the art would understand how the one-shot signal may be used in synchronous mode to capture data updates in the second storage array.

As shown in FIG. 6, the one-shot signal ("shadow_enable") and the Adv_sync_o control signal are generated after a short time delay at time $t_1$. The one-shot signal is supplied to synchronized update logic block 460 for capturing data updates. The Adv_sync_o control signal is supplied to data interface logic block 440 for controlling the opening and closing of the data latch contained therein. When the one-shot signal is deasserted (e.g., in a logic high state), output data from second storage array 430 may be passed to the registers $460C_i$ within the synchronized update logic block 460. However, no further changes are accepted from the second storage array 430 once the one-shot signal is asserted (e.g., goes to a logic low state) at time $t_2$. The retrieved data value (e.g., 4) is supplied to the data latch at time $t_3$, well before the Adv_sync_o signal arrives to close the latch at time $t_4$. In other words, the Adv_sync_o signal ensures that the retrieved data will arrive at the data latch at least a set-up time before the Adv_sync_o signal is deasserted to close the latch. The retrieved data value is forwarded out of the memory device at time $t_5$ in sync with the high speed clock ("M*clock_2").

If data updates occur when the one-shot signal is asserted, the data updates will be allowed to propagate to the output on the next cycle of the high speed clock signal ("M*clock_2"). By synchronizing data updates to the high speed clock, logic blocks 450 and 460 prevent metastability during read accesses by ensuring that changes to the data within the second storage array only propagate to the output during a specific time.

Figure 2:
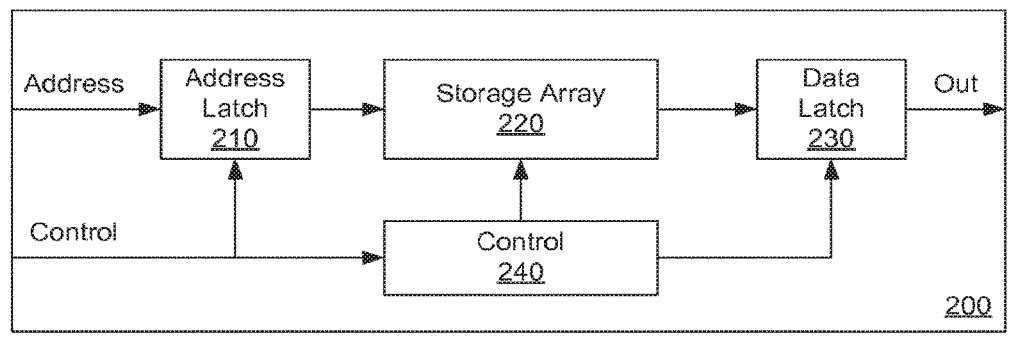
FIG. 2 is a block diagram illustrating one embodiment of a conventional memory interface configured for asynchronous operation.
Figure 3:
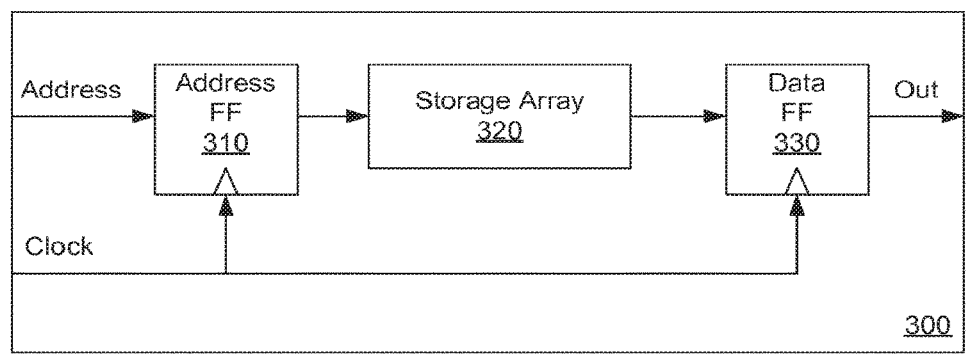
FIG. 3 is a block diagram illustrating one embodiment of a conventional memory interface configured for synchronous operation.

Various embodiments of an improved memory interface circuit have now been described in reference to FIGS. 4 and 5. The embodiment shown in FIGS. 4 and 5 presents many advantages over the conventional architectures shown in FIGS. 2 and 3. For example, the embodiment shown in FIGS. 4 and 5 enables the improved memory interface to be configured in either one of two available modes (synchronous and asynchronous) and allows the storage arrays included therein to reside within substantially any clock domain (i.e., so that they may be controlled by substantially any clock signal supplied to the memory device). In addition, the improved memory interface includes logic blocks (e.g., 450 and 460) to avoid metastability during synchronous and asynchronous modes of operation. Further advantages may become apparent in light of the description provided herein.

In one embodiment, the improved memory interface circuit may be incorporated within a memory device (as shown, e.g., in FIG. 1). However, the improved memory interface circuit may be used wherever there is a need to access storage, and therefore, is not specifically limited to a memory device. A method for using the improved memory interface circuit may also be contemplated herein.

Figure 7:
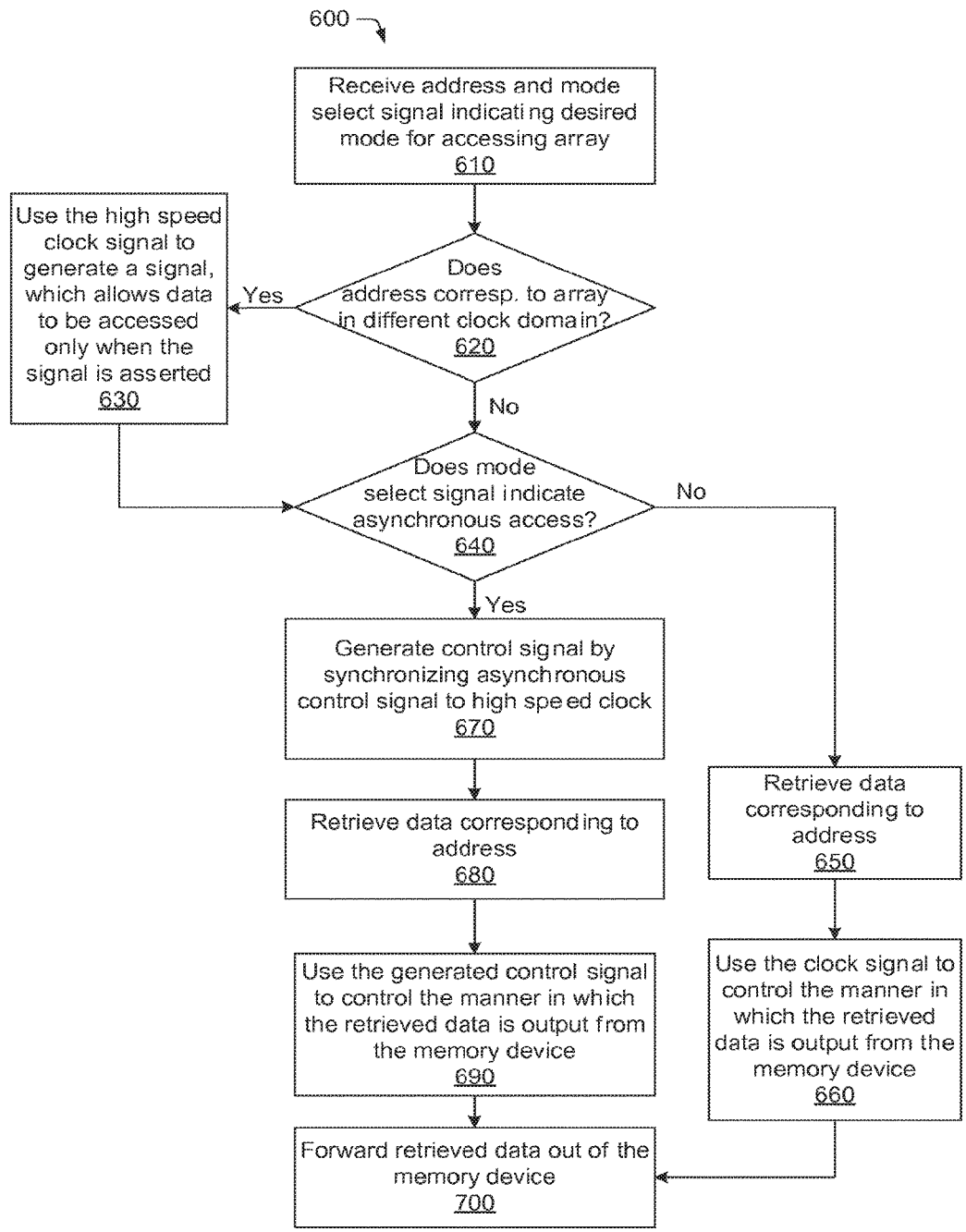
FIG. 7 is a flowchart diagram illustrating one embodiment of a method for accessing a memory device that supports both synchronous and asynchronous modes of operation.

FIG. 7 illustrates one embodiment of a method 600 for accessing a memory device that supports both synchronous and asynchronous modes of operation. As noted above, the memory device may include a plurality of storage arrays. In some cases, at least one of the storage arrays may reside within a different clock domain than the other interface components and storage arrays. The method described below prevents metastability in the data retrieved from the different clock domain by synchronizing the data access to a high speed clock.

In some cases, the method may begin 610 by receiving an address of data to be accessed from an array, along with a mode selection signal indicating whether the data should be accessed in synchronous or asynchronous mode. A clock signal or asynchronous control signal may also be received 610, depending on the mode selected for accessing the data. Next, the method may determine 620 if the address corresponds to data stored within the at least one storage array (i.e., the array or arrays residing in the different clock domain). If the addressed data is not stored in the at least one storage array, the method will proceed with steps 640-700, as discussed below.

If the addressed data is stored in the at least one storage array, the method may use the high speed clock signal to generate a signal 630, which prevents any changes that occur within the data from propagating out of the memory device while the data is being accessed from the at least one storage array. In synchronous mode, the signal may be generated by synchronizing the clock signal to a high speed clock signal. In asynchronous mode, the signal may be generated by synchronizing the asynchronous control signal to the high speed clock signal. In one embodiment, the signal may be a pulse, which (i) allows the data to propagate out of the memory device when the pulse is asserted, and (ii) prevents any changes that occur within the data from propagating out of the memory device when the pulse is deasserted. In one embodiment, the pulse may only be asserted for about one clock cycle of the high speed clock signal.

Next, the method may determine 640 whether the mode selection signal indicates that the data should be accessed in synchronous or asynchronous mode. If synchronous mode is desired, the addressed data may be retrieved from the corresponding storage array 650, and output from the memory device 660 in sync with the clock signal, and the retrieved data is then forwarded out of the memory device 700. If asynchronous mode is desired, the method may generate a control signal 670 by synchronizing the asynchronous control signal to the high speed clock signal. After the addressed data is retrieved from the corresponding storage array 680, the control signal may be used to control the manner in which the data is output from the memory device 690, and the retrieved data is then forwarded out of the memory device 700. For example, the generated control signal may be supplied to a latch, which is coupled for receiving the data before it is forwarded out of the memory device 700. In one embodiment, the control signal may prevent the data from entering a metastable state by opening the latch as soon as possible (e.g., two to three clock cycles of the high speed clock signal) and closing the latch in synchronization with the high speed clock signal. In other words, the control signal may enable the data to arrive at the latch at least a set up time before the latch is closed to output the data.

It will be appreciated to those skilled in the art having the benefit of this disclosure that this invention is believed to provide an improved memory interface circuit. More specifically, the invention provides a memory interface circuit that improves upon conventional architectures by: (i) providing the flexibility of accessing storage arrays in one of two available modes (synchronous and asynchronous), (ii) providing access to a plurality of storage arrays, at least one of which resides within a different clock domain than the other interface components and (iii) providing means for guaranteeing that the data output from the storage arrays will be stable, regardless of the clock domain or mode chosen for accessing the data. Further modifications and alternative embodiments of various aspects of the invention will be apparent to those skilled in the art in view of this description. It is intended, therefore, that the following claims be interpreted to embrace all such modifications and changes and, accordingly, the specification and drawings are to be regarded in an illustrative rather than a restrictive sense.

What is claimed is:

1. A system comprising:
   a memory controller; and
   a memory device coupled to and external to the memory controller, the memory device comprising:
      a storage array having dual configurability to support both synchronous and asynchronous modes of operation; and
      a control logic including a control signal multiplexer coupled to a chain of registers, wherein the control signal multiplexer is configured to selectively forward a clock signal or an asynchronous control signal to the chain of registers depending on a selected mode of operation.

2. The system of claim 1, wherein the memory controller controls access to the storage array in a first mode of operation during a first time period and in a second mode of operation during a second time period.

3. The system of claim 2, wherein the first mode of operation is a synchronous mode and the second mode of operation is an asynchronous mode.

4. The system of claim 1, wherein the storage array is one of a Static Random Access Memory (SRAM) array, an array of registers, and an array of latches.

5. The system of claim 1, wherein the memory controller is one of a microprocessor, a microcontroller, and an application specific integrated circuit (ASIC).

* * * * *